(12) United States Patent
Ilyas et al.

(10) Patent No.: US 10,560,098 B2
(45) Date of Patent: Feb. 11, 2020

(54) MECHANICAL RESONATOR BASED CASCADABLE LOGIC DEVICE

(71) Applicant: KING ABDULLAH UNIVERSITY OF SCIENCE AND TECHNOLOGY, Thuwal (SA)

(72) Inventors: Saad Ilyas, Thuwal (SA); Md Abdullah Al Hafiz, Thuwal (SA); Hossein Fariborzi, Thuwal (SA); Mohammad Ibrahim Younis, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/332,150

(22) PCT Filed: Sep. 21, 2017

(86) PCT No.: PCT/IB2017/055741
§ 371 (c)(1),
(2) Date: Mar. 11, 2019

(87) PCT Pub. No.: WO2018/055554
PCT Pub. Date: Mar. 29, 2018

(65) Prior Publication Data
US 2019/0341920 A1 Nov. 7, 2019

Related U.S. Application Data

(60) Provisional application No. 62/397,406, filed on Sep. 21, 2016.

(51) Int. Cl.
*H03K 19/02* (2006.01)
*H03H 9/02* (2006.01)
(Continued)

(52) U.S. Cl.
CPC ......... *H03K 19/02* (2013.01); *H03H 9/02259* (2013.01); *H03H 9/2463* (2013.01);
(Continued)

(58) Field of Classification Search
CPC .......... H03H 9/00; H03H 9/24; H03H 9/2405; H03H 9/2447; H03H 9/2463
(Continued)

(56) References Cited

U.S. PATENT DOCUMENTS

| 2011/0163817 A1* | 7/2011 | Nakamura ......... H03H 9/02259 331/18 |
| 2011/0221301 A1* | 9/2011 | Hentz ..................... G01C 19/56 310/309 |
| 2012/0319790 A1* | 12/2012 | Nakamura ......... H03H 9/02259 331/154 |

OTHER PUBLICATIONS

Md Abdullah Al Hafiz, et al. "A Microbeam Resonator With Partial Electrodes for Logic and Memory Elements," IEEE Journal of Exploratory Solid-State Computational Devices and Circuits, vol. 3, Nov. 10, 2017 (Year: 2017).*
(Continued)

*Primary Examiner* — Seokjin Kim
(74) *Attorney, Agent, or Firm* — Patent Portfolio Builders PLLC

(57) ABSTRACT

A mechanical resonator-based cascadable logic device includes which includes a resonator having a beam with a first fixed end, a second fixed end, and a length between the first and second fixed ends. A first electrode and a second electrode are aligned along a first side of the beam. A third electrode and a fourth electrode are aligned along a second side of the beam and opposite the first and second electrodes. A DC voltage source is coupled to one of the first and second fixed ends of the beam. At least one of the first, second, third, and fourth electrodes is coupled to a first AC voltage source
(Continued)

so that a logic operation is performed by activating a second resonant mode of the resonator.

20 Claims, 9 Drawing Sheets

(51) Int. Cl.
  *H03H 9/24* (2006.01)
  *H03K 19/20* (2006.01)
  *H03K 19/21* (2006.01)
(52) U.S. Cl.
  CPC .............. *H03K 19/20* (2013.01); *H03K 19/21* (2013.01); *H03H 2009/02496* (2013.01)
(58) Field of Classification Search
  USPC ................ 331/154, 116 R, 116 FE, 158, 160
  See application file for complete search history.

(56) References Cited

OTHER PUBLICATIONS

Akarvardar, K. et al., "Design Considerations for Complementary Nanoelectromechanical Logic Gates," 2007 IEEE International Electron Devices Meeting: Washington, DC, Dec. 10-12, 2007, pp. 299-302.

Guerra, D.N,, et al., "A Noise-Assisted Reprogrammable Nanomechanical Logic Gate," Nano Letters, Apr. 14, 2010, vol. 10, No. 4, pp. 1168-1171.

Hafiz, M.A.A., et al., "Microelectromechanical Reprogrammable Logic Device," Nature Communications, Mar. 29, 2016, vol. 7, 11137.

International Search Report in corresponding/related International Application No. PCT/IB2017/055741, dated Jan. 5, 2018.

Jaber, N.R., et al., "Clamped-Clamped Microbeam Resonators of Enhanced Higher Order-Modes Response and Wide Bandwidth," ICQNM 2015: The Ninth International Conference on Quantum, Nano/Bio, and Micro Technologies, Jan. 1, 2015, pp. 22-28.

Mahboob, I., et al., "Interconnect-Free Parallel Logic Circuits in a Single Mechanical Resonator," Nature Communications, Feb. 15, 2011, vol. 2, Article No. 198.

Ramini, A., et aL, "Efficient Primary and Parametric Resonance Excitation of Bistable Resonators," AIP Advances, American Institute of Physics, Sep. 12, 2016, vol. 6, No. 9, pp. 095307-1-095307-7.

Written Opinion of the International Searching Authority in corresponding/related International Application No. PCT/IB2017/055741, dated Jan. 5, 2018.

* cited by examiner

US 10,560,098 B2

MECHANICAL RESONATOR BASED CASCADABLE LOGIC DEVICE

CROSS-REFERENCE TO RELATED APPLICATIONS

This application is a U.S. National Stage Application of International Application No. PCT/IB2017/055741, filed on Sep. 21, 2017, which claims priority and benefit from U.S. Provisional Application No. 62/397,406, filed Sep. 21, 2016, the entire contents of which are incorporated herein by reference.

BACKGROUND

Technical Field

Embodiments of the subject matter disclosed herein generally relate to mechanical resonators configured to operate as logic devices.

Discussion of the Background

Computation using mechanical elements, at least a century old concept, was rendered obsolete by CMOS transistor's size and computing capabilities. However, with the advancements in the areas of micro/nano fabrication and with CMOS transistors reaching their physical limits the concept of mechanical computing has been revitalized. Microelectromechanical systems (MEMS) based technology being immune to ionizing radiations and ability to work in harsh environment conditions offers several advantages over its CMOS based counterpart. This is why the development of MEMS/NEMS computing units, i.e., logic and memory devices, have been an active front of research for the past decade. These devices are believed to be a fundamental part of future computing units where MEMS based technology overcomes CMOS-based technology in process capabilities.

SUMMARY

According to an embodiment there is an apparatus, which includes a resonator, including a beam having a first fixed end, a second fixed end, and a length between the first and second fixed ends. A first electrode and a second electrode are aligned along a first side of the beam. A third electrode and a fourth electrode are aligned along a second side of the beam and opposite the first and second electrodes. A DC voltage source is coupled to one of the first and second fixed ends of the beam. At least one of the first, second, third, and fourth electrodes is coupled to a first AC voltage source so that a logic operation is performed by activating a second resonant mode of the resonator.

According to another embodiment there is a method, which involves supplying a DC voltage to one of a first and second fixed end of a beam of a resonator. The beam has a length between the first and second fixed ends. A first AC voltage is supplied to one of the first, second, third, and fourth electrodes. The first and second electrodes are aligned along a first side of the beam, and the third and fourth electrodes are aligned along a second side of the beam and opposite the first and second electrodes. An output is generated from another one of the first, second, third, and fourth electrodes. The output is a result of a logic operation of at least the first AC voltage.

According to yet another embodiment there is an apparatus, which includes a first and second logic device. The first logic device includes a first resonator, including a first beam having a first fixed end, a second fixed end, and a length between the first and second fixed ends, a first electrode and a second electrode aligned along a first side of the beam, and a third electrode and a fourth electrode aligned along a second side of the beam and opposite the first and second electrodes. The second logic device includes a second resonator, including a second beam having a first fixed end, a second fixed end, and a second length between the first and second fixed ends, a fifth electrode and a sixth electrode aligned along a first side of the second beam, and a seventh electrode and an eighth electrode aligned along a second side of the second beam and opposite the fifth and sixth electrodes. A first AC voltage source is coupled to one of the first, second, third, and fourth electrodes, and another one of the first, second, third, and fourth electrodes is coupled to one of the fifth, sixth, seventh, and eighth electrodes.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 10 and 1D respectively illustrate mode shapes of symmetrically and asymmetrically driven beams according to embodiments;

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of cascadable mechanical resonator-based logic devices. However, the embodiments to be discussed next are not limited to cascadable mechanical resonator-based logic devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
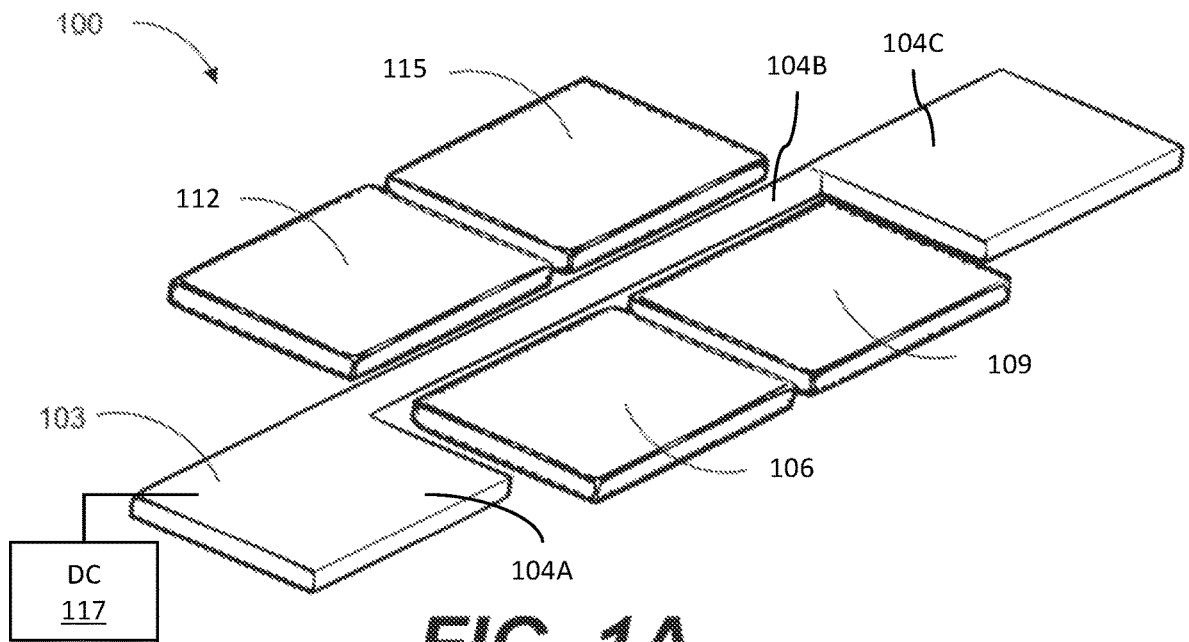
FIG. 1A is an illustration of a mechanical resonator-based cascadable logic device according to an embodiment.

Referring now to FIG. 1A, an apparatus 100 includes a resonator, including a beam 103 having a first fixed end 104A, a second fixed end 104C, and a length 1048 between the first fixed end 104A and second fixed end 104C. A first electrode 106 and a second electrode 109 are aligned along a first side of the beam 103. A third electrode 112 and a fourth electrode 115 are aligned along a second side of the beam 103 and opposite the first 106 and second 109 electrodes. A DC voltage source 117 is coupled to one of the first and second fixed ends of the beam 103, which in the illustrated embodiment is the first fixed end 104A. At least one of the first 106, second 109, third 112, and fourth 115 electrodes is coupled to a first AC voltage source (not illustrated) so that a logic operation is performed by activating a second resonant mode of the resonator. The manner of coupling one or more of the first 106, second 109, third 112, and fourth 115 electrodes to the first AC voltage source affects the logic device formed by the apparatus 100, which will be described in more detail below.

The beam 103 is a clamped-clamped beam (or microbeam) in which ends 104A and 1040 are clamped, fixed, or held in place, while the length 104B is allowed to vibrate. The particular clamped-clamped beams illustrated and discussed herein are examples of one type of beam geometry, and the present invention can be employed with any type of clamped-clamped arrangement, including circular membranes, square plates, and other structures.

The electrodes 106 and 109 can be considered one split electrode, and the electrodes 112 and 115 can be considered another split electrode. Each of the electrodes 106 and 109 are aligned along substantially half of the length 1048 of the beam 103, each electrode starts substantially at each end of the length 1048 of the beam 103. Each of the electrodes 106, 109, 112, and 115 are aligned along substantially half of the length 1048 of the beam 103. It should be recognized that "substantially half of the length 104B" will in practice be slightly less than the length 1048 due to the requirement for lateral spaces between the electrodes 106, 109, 112, and 115 and the ends of the beams 104A and 104C, as well as required spacing between electrodes adjacent to each other on one of the sides of the beam (i.e., spacing between electrodes 106 and 109, and spacing between electrodes 112 and 115). In other embodiments, the electrodes can be above and below the beam, and more or fewer electrodes can be utilized using the principles of the present disclosure.

In an embodiment, each electrode 106, 109, 112, and 115 is in the form of a square having sides of, for example, 288 µm, and there can be an 8 µm space between adjacent electrodes on one side. Further, in an embodiment, the beam 103 can have a length 104B of 600 µm, width of 3 µm, height of 30 µm, and there can be an 8 µm space between the beam 103 and the electrodes 106, 109, 112, and 115. These dimensions are non-limiting examples and other dimensions can be employed.

Depending on the choice of electrodes for driving and sensing, the electrodes 106, 109, 112, and 115 can facilitate the excitation of a first mode or a second mode of vibration to achieve different logic operations. Other modes may be used in one application. For example, applying or driving an AC signal to any one of the electrodes 106, 109, 112, or 115, individually can activate the second mode of vibration of the resonator, because each electrode is substantially half of the length 104B of the beam 103 of the resonator. However, when an AC signal is applied to both electrodes on one side of the beam concurrently, for example, the electrodes 106 and 109 concurrently, then the second mode of vibration is not activated and cannot be sensed, for example, at the other electrodes 112 and 115. Further configurations of driving and sensing are described herein, and various logic operations can be achieved. While the resonator is shown having a particular shape and configuration, this configuration is illustrative of many possible shapes and configurations that can be designed using the principles described herein. For example, the particular shape of the beam, the clamped ends of the beams, and the electrodes can include a variety of shapes and configurations.

Figure 1B:
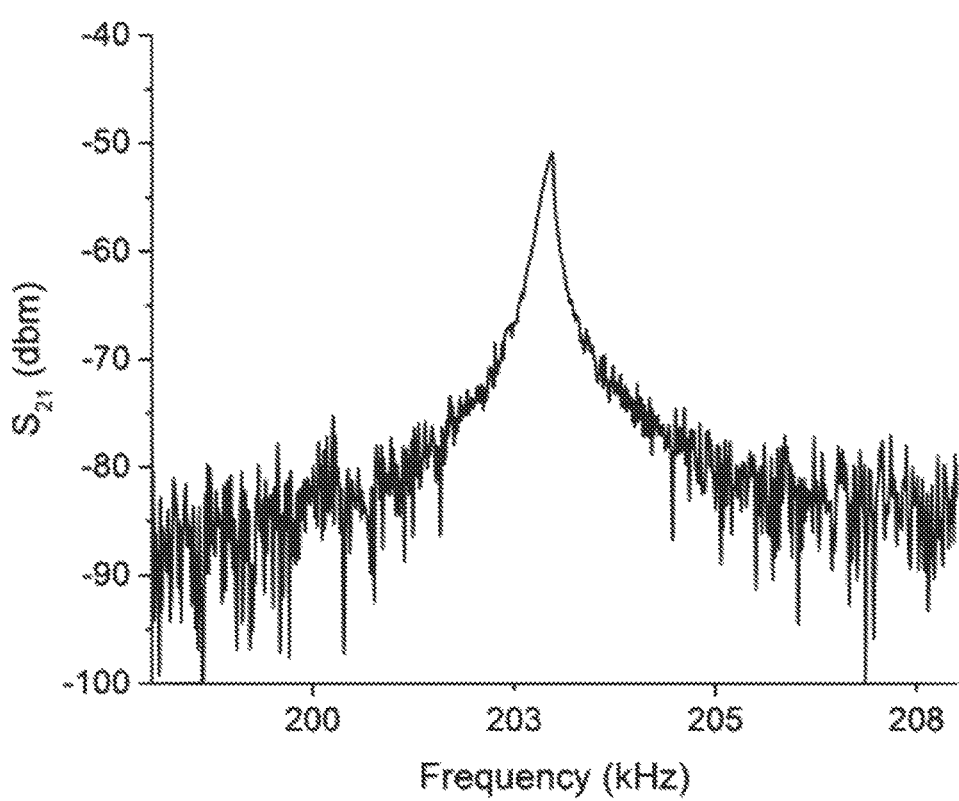
FIG. 1B is a graph illustrating an example response of the mechanical resonator-based cascadable logic device of FIG. 1A according to an embodiment.

FIG. 1B is a graph that illustrates a response of the mechanical resonator-based cascadable logic device 100. The response shown in FIG. 1B corresponds to a half electrode excitation, for example, when a signal is applied to only one of the electrodes 112 or 115 of FIG. 1A. The response shown in FIG. 1B can also be achieved, for example, when a signal is applied to only one of the electrodes 106 or 109 of FIG. 1A. In FIG. 1B, the frequency of the signal applied to one of the electrodes is swept across a range of frequencies. When the frequency starts nearing the resonance frequency for given AC and DC voltage, the amplitude starts to peak. For FIG. 1B, this maximum value occurs around 203 kHz. This is the frequency value for the second resonant mode of the beam under test, and can vary depending on the dimensions of the beam under consideration and other factors. When the resonator will work as a logic device it can receive inputs around this frequency and provide outputs around this frequency. The frequency (e.g. 203 kHz) can be referred to as the operating frequency of this specific resonator under test in FIG. 1B.

Embodiments of the present disclosure include mechanical resonator-based cascadable logic devices. These devices can perform fundamental logic gate operations, e.g., OR, XOR, and NOT, for example, using silicon based MEMS resonators operating in the linear regime. The OR and NOT gate using MEMS resonators can be cascaded to realize the NOR gate, which is a universal logic gate that can perform all the logic operations by further cascading. These logic devices can operate at room temperature under modest vacuum conditions, and can employ a CMOS-compatible mass fabrication process, and can be formed, for example, on a substrate. For example, the logic devices can operate around 10-45 degrees Celsius, and around 1 torr. They can also operate at pressures less than 1 torr, requiring less voltage at lower pressures, or at pressures higher than 1 torr, requiring more voltage. They can also operate at other temperatures. The cascadability of the logic devices allows the NOR gate to act as a basic building block to perform complex computing operations.

Figure 1C:
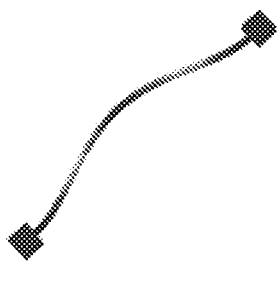
Figure 1D:
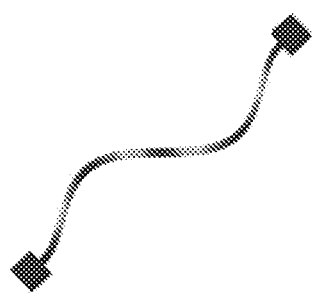

MEMS resonators, whenever excited by electrostatic loading, vibrate at different fundamental modes of vibration depending on the frequency values chosen. Different modes of vibration can be excited by using suitable electrode configurations that stimulate the desired mode shapes. For example, FIG. 1C illustrates a mode shape (the first mode) for a symmetrically-driven resonator (i.e., both electrodes on one side of the beam are driven) and FIG. 1D illustrates the mode shape (second mode) for an asymmetrically-driven resonator (i.e., only one of the two electrodes on each side of the beam is driven). The underlying principal of operation for the proposed logic device depends on the activation (1) and deactivation (0) of a second resonant mode of a resonator, which is illustrated by the mode shape in FIG. 1D. Such a resonator can be excited to resonate at a set of frequencies. The frequencies at which a resonator resonates can be referred to as resonant modes. In one example, a resonator can have a vibrating or oscillating beam with both ends fixed, or clamped. If, as illustrated in FIG. 1C, the beam has one peak on the beam, it can be said to have a mode shape of half of a sine waveform, and it is oscillating at a first resonant mode. If, as illustrated in FIG. 1D, the shape of the beam is a full sine wave having one peak and one trough, then it is oscillating in a second resonant mode.

When voltage is applied across parallel plates, an electrostatic force can cause a pulling effect between the plates. This attraction or pulling force can be used to cause an attraction between a beam of a resonator (especially if a DC voltage is applied to the beam to create a constant electric current) and an electrode (or electrodes) aligned along the beam. A voltage or a signal applied to an electrode (the voltage or signal is applied to two electrodes, one on each side of the beam) can cause vibration or oscillation of the beam. For example, if an AC signal is applied to opposite electrodes, the fluctuating voltage between the electrodes can result in a fluctuating force between the electrodes and the beam, and the beam can be made to vibrate or oscillate. If the electrode is aligned along the entire length of the beam, a first mode of vibration can be activated. Electrodes aligned along the beam can be substantially adjacent to the beam.

A second mode of vibration can be activated when a half of the electrode on one side of the beam is used to excite the resonator, for example, by applying a voltage or a signal to the half electrode. In other words, the second resonant mode can be activated by exciting the resonator using an electrode (or a plurality of electrodes) aligned along the beam that is substantially half of the length of the beam, or extends adjacent to substantially half the length of the beam. Similar principles can be used to cause further modes of vibration.

Multiple electrodes can be aligned opposite each other on opposite sides of a beam, and each electrode can be used to cause a vibration of the beam when an AC signal or other periodic signal is applied. In some embodiments, the electrodes can be on lateral sides of the beam, causing a horizontal vibration or oscillation. In other embodiments, the electrodes can instead be above and below the beam, and can be used to cause a vertical vibration of the beam. Vibration and resonance using multiple electrodes on substantially opposite sides of a beam of a resonator are further discussed below with reference to the figures.

Figure 2A:
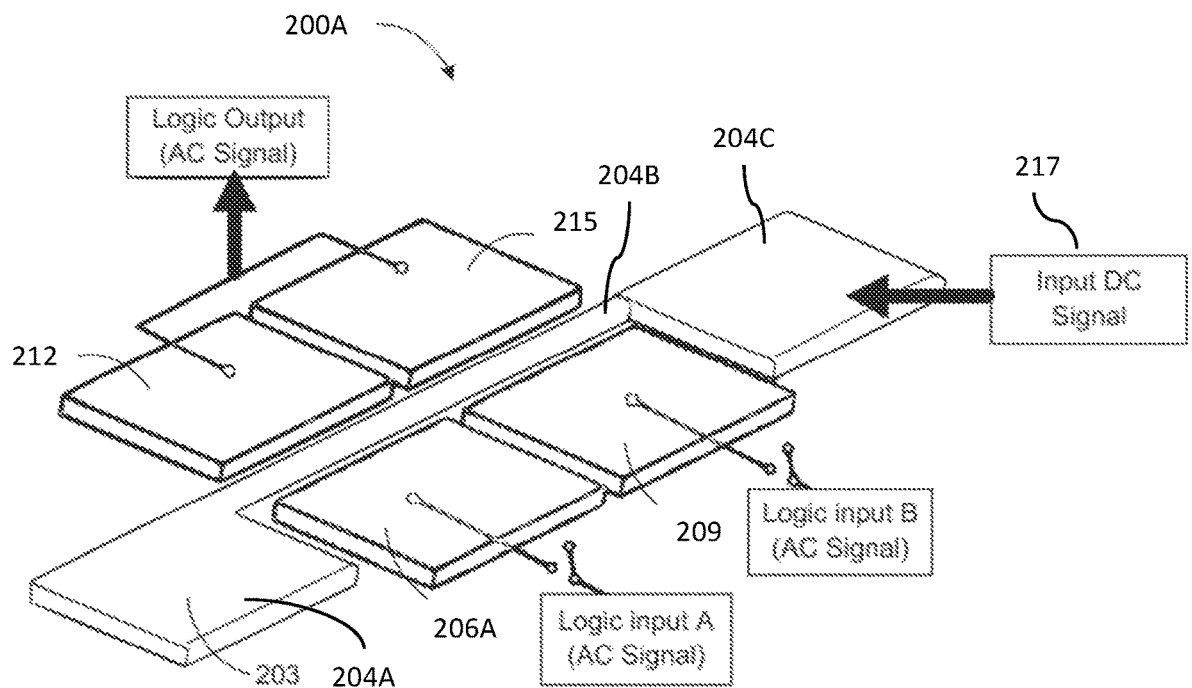
FIG. 2A is an illustration of another mechanical resonator-based cascadable logic device according to an embodiment.

FIG. 2A illustrates a mechanical resonator-based cascadable logic device 200A, which is configured to operate as an XOR gate. The structure of the mechanical resonator-based cascadable logic device 200A is similar to the mechanical resonator-based cascadable logic device 100 of FIG. 1A. The mechanical resonator-based cascadable logic device 200A has a clamped-clamped beam 203, and electrodes 206A, 209, 212, and 215. The electrodes 206A and 209 can be considered one split electrode, and the electrodes 212 and 215 can be considered another split electrode. An input DC signal or DC voltage 217 can be applied to the end 204C the clamped-clamped beam 203. While the input DC signal is illustrated as being applied on end 204C, the input DC signal can be applied on end 204A or any part of the beam 203 so long as it does not affect the resonance of the beam 203. The input DC signal and the input AC signals discussed below can be used to cause the clamped-clamped beam 203 to resonate in one of the first and second modes depending upon the logic input AC signals supplied to the electrodes.

In the configuration shown, the electrode 206A can be a logic input A, and the electrode 209 can be a logic input B. The electrodes 212 and 215 can be coupled together and used as a logic output. In some embodiments, a single one of the electrodes 212 or 215 can be used as the logic output. An AC signal can be applied for each of the logic inputs A and B. The frequency of the AC signal applied to each of the logic inputs A and B can be the operating frequency of the resonator. The (0,0) case can be described as when the AC signal is applied to neither logic input A, nor the logic input B. The (0,1) case can be described when the AC signal is not applied to the logic input A, but the AC signal is applied to the logic input B.

For the (0, 0) case there is no signal applied to either input, and there is no output, so the response of the resonator is negligible (0). For the (1,0) case, the AC signal is applied to the logic input A, but not the logic input B. A half electrode 206A (an electrode that is substantially half of the length of the beam 203) is active, which activates the second resonance mode of the beam 203 and the resonator vibrates with a high amplitude (1). For the (0,1) case, the AC signal is applied to the logic input B, but not the logic input A. Again, a half electrode 209 is active, which activates the second resonance mode of the beam 203 and the resonator vibrates with a high amplitude (1). Finally, for the (1, 1) case the full electrode (both of the electrodes 206A and 209) is activated and since a half electrode is required to excite the second mode, the response of the resonator is again negligible (0). Thus, the resonator performs the desired XOR gate.

Figure 2C:
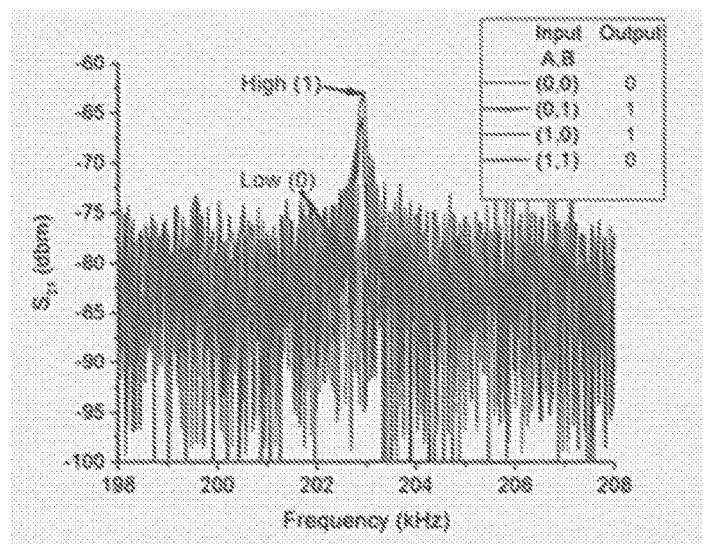
FIG. 2C is a graph illustrating an example response of the mechanical resonator-based cascadable logic device of FIG. 2A according to an embodiment
Figure 2B:
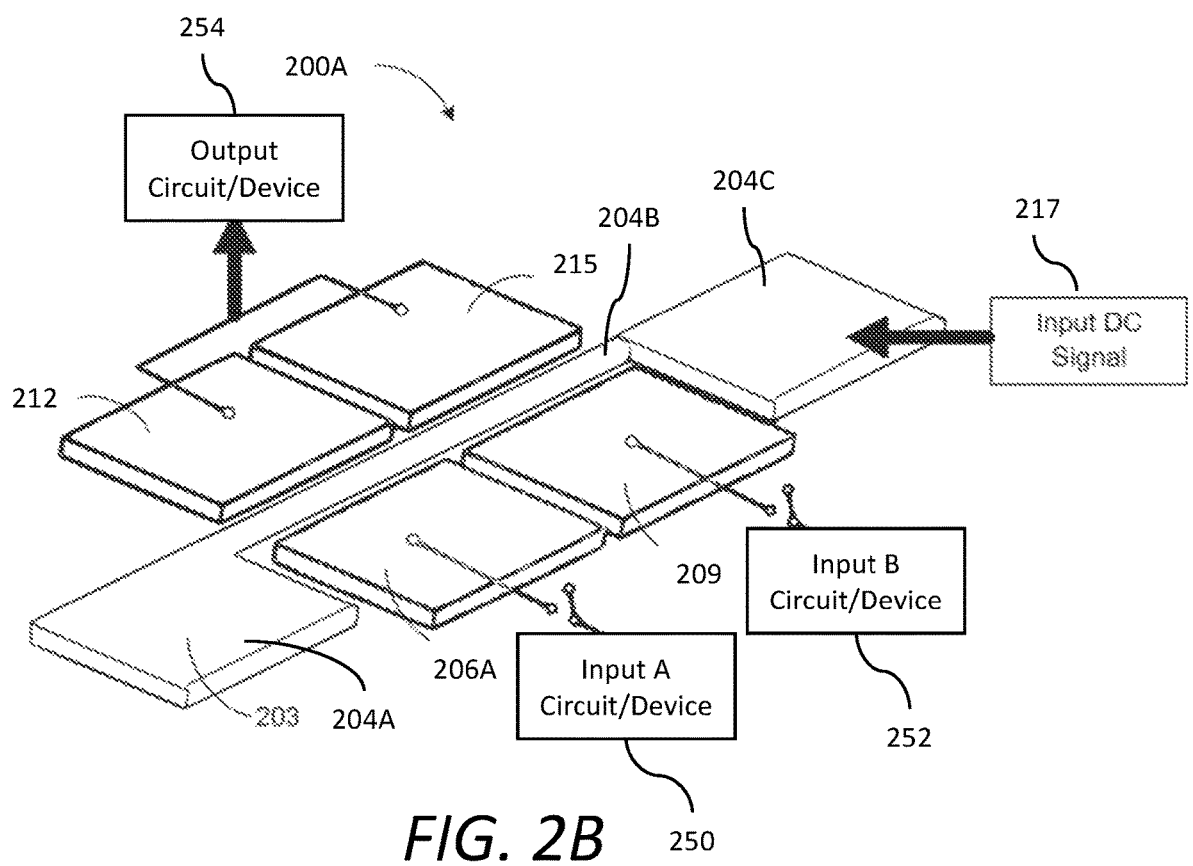
FIG. 2B is another illustration of the mechanical resonator-based cascadable logic device of FIG. 2A according to an embodiment.

FIG. 2B is another illustration of the mechanical resonator-based cascadable logic device of FIG. 2A. As illustrated, a first circuit or device 250 provides a first AC signal as the logic input A to electrode 206A and a second circuit or device 252 provides a second AC signal as the logic input B to electrode 209. If circuits or devices 250 and 252 output DC signals, a DC-to-AC converter can be coupled between the circuits or devices 250 and 252 and the corresponding electrodes 206A and 209. Alternatively, circuits or devices 250 and/or 252 can have a DC-to-AC converter integrated within the respective circuit or device.

Depending upon the particular AC signals provided by circuits or devices 250 and 252, the beam 203 will resonate and the electrodes 212 and 215 will generate a corresponding AC signal that is provided to output circuit or device 254, which can be another mechanical resonator-based cascadable logic device (as discussed below in connection with FIGS. 4A, 4B, and 5A-5D) or another device that operates based on the results of the logic operation performed by the device 200A. Depending upon implementation, a signal conditioning circuit, including an amplifier, can be arranged between electrodes 212 and 215 and the output circuit or device 254.

FIG. 2C is a graph illustrating a response of the mechanical resonator-based cascadable logic device 200A being configured as an XOR gate. The resonator can be configured as other types of logic gates when the electrodes are otherwise configured, examples of which are discussed below. The operating frequency is shown to be around 203 kHz.

Figure 2D:
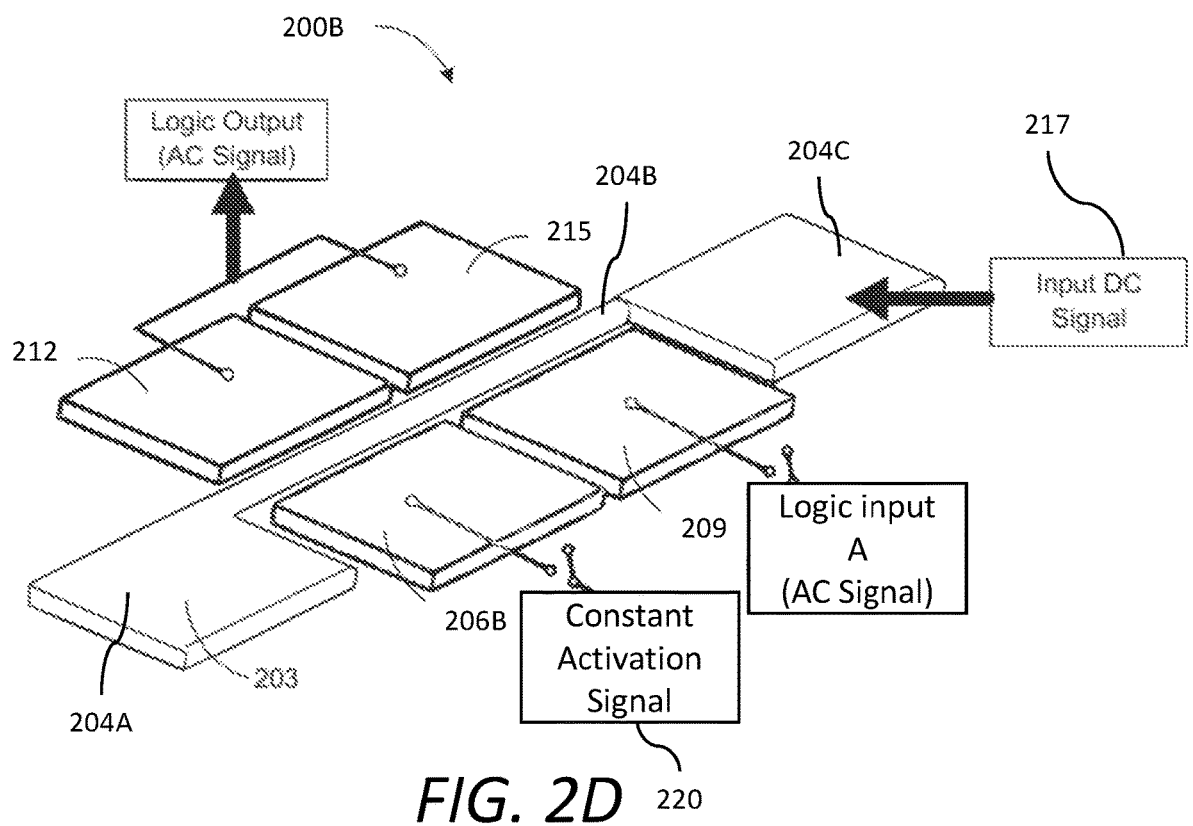
FIG. 2D is an illustration of a further mechanical resonator-based cascadable logic device according to an embodiment.

A similar configuration to that of FIG. 2A can be used to realize NOT gate operation (i.e., an inverter operation), an example of which is illustrated in FIG. 2D, which is designated by reference number 200B. In contrast to the XOR gate arrangement of FIG. 2A, in which the electrode 206A is coupled to a logic input A, the electrode 206B in FIG. 2D is connected to a constant AC signal 220. The constant AC signal 220 can be utilized as a reference signal, fixed at a high (1) state using a constant activation signal throughout the logic computation. In other words, an AC signal is constantly applied to the electrode 206B. Now, whenever the input A is high (1) the full electrode is active and the resonator shows negligible response (0) similar to (1, 1) case described above for FIG. 2A. When the input A is at low (0) state, the half electrode is activated and hence, the second resonant mode is excited giving a high (1) response. Because the resonator complements the input provided, it performs the NOT gate operation. Alternatively, the electrode 209 can be fixed at the high state, while the electrode 206B is used as the input.

Figure 3A:
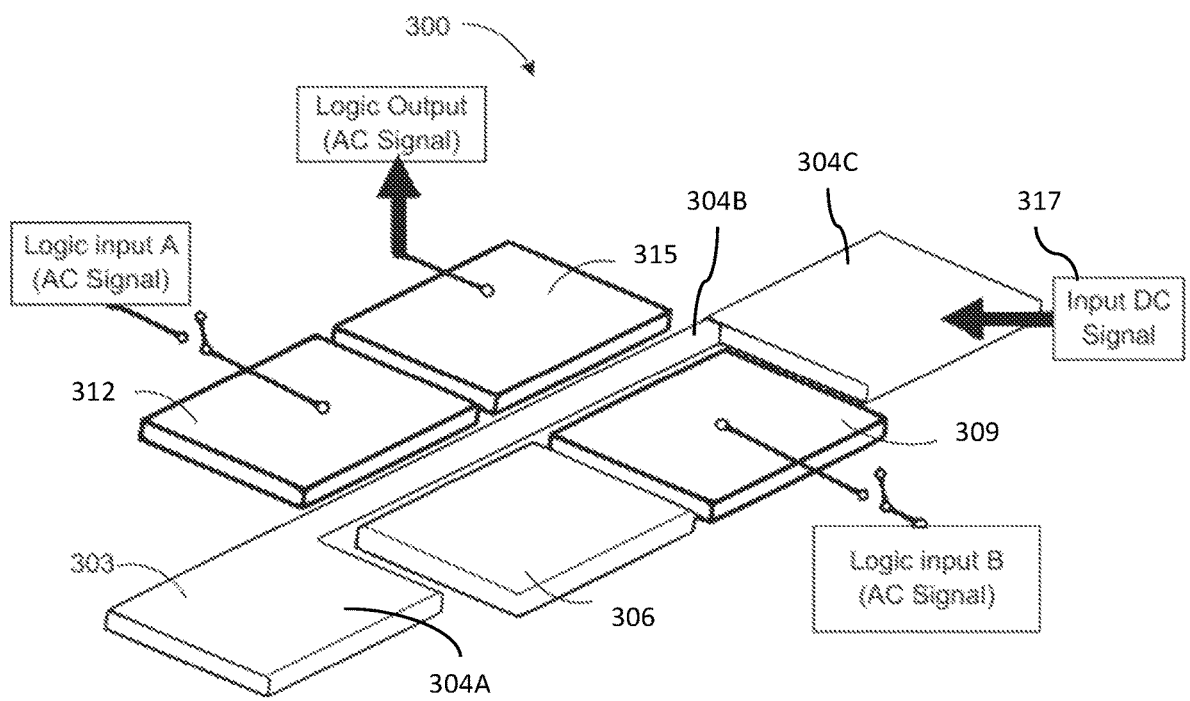
FIG. 3A is an illustration of yet another mechanical resonator-based cascadable logic device according to an embodiment.

FIG. 3A illustrates a mechanical resonator-based cascadable logic device 300 configured to operate as an OR gate. The structure of the mechanical resonator-based cascadable logic device 300 is similar to the mechanical resonator-based cascadable logic device 100 of FIG. 1A. The mechanical resonator-based cascadable logic device 300 has a clamped-clamped beam 303, and electrodes 306, 309, 312, and 315. The electrodes 306 and 309 can be considered one split electrode, and the electrodes 312 and 315 can be considered another split electrode. Consistent with the discussion above, input DC signal 317 can be applied to end 304C (as illustrated), end 304A, or any other part of the beam so long as it does not affect the resonance of the beam. Similar to the previous devices, a length 304B of beam 303 is arranged between clamped ends 304A and 304C.

A diagonal driving configuration with sensing from one electrode can be used to realize the OR gate. For example, as shown, the electrodes 312 and 309 can be used as a logic input A and a logic input B, respectively. The electrode 315 can be used as a logic output. Electrode 306 can be left floating and not connected to an AC input. For (0, 0) case the beam shows no response and a low (0) output state is recorded. For both the (0, 1) case and the (1, 0) case, a half electrode is active on either side and the second mode is activated. Thus, a high (1) state can be observed at the output. For the (1, 1) case a half electrode is active on each side at the same time, which still fulfills the condition for activation of the second resonant mode and again a high (1) output state can be observed.

Figure 3B:
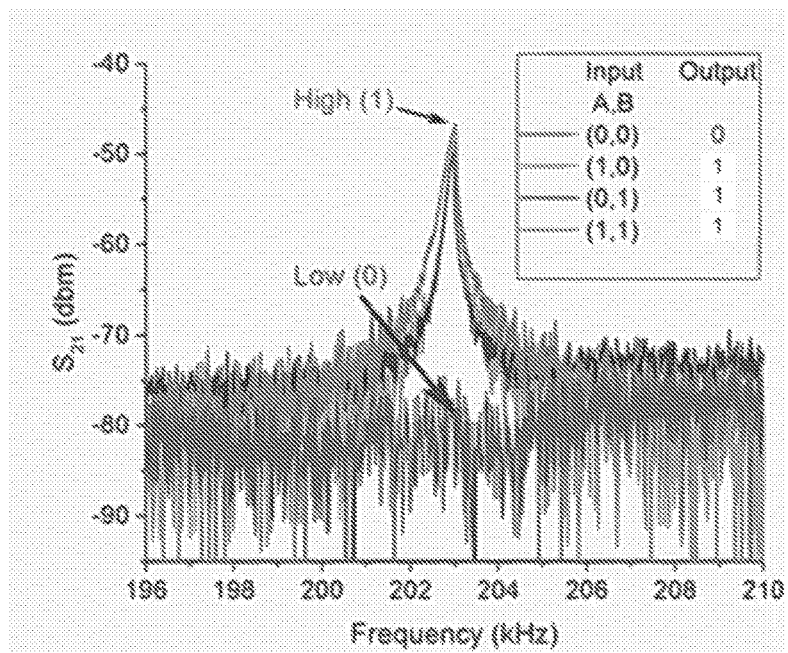
FIG. 3B is a graph illustrating an example response of the mechanical resonator-based cascadable logic device of FIG. 3A according to an embodiment.

FIG. 3B is a graph that illustrates a response of the mechanical resonator-based cascadable logic device 300 as an OR gate. As illustrated in FIG. 3B, the output signal for the (1,1) logic input case for the OR operation is slightly larger than the output signal for the (1,0) and (0,1) cases. The difference is due to the fact that the drive and sense electrode configuration for the (1,1) case excites the second resonance mode most strongly. If this difference results in issues when cascading the mechanical resonator-based logic devices, the operation frequency of the device can be selected such that the difference between the high output signal amplitudes for all the logic input conditions are within an acceptable margin so that the subsequent circuits can treat them as a single state (High).

Comparing the graph of FIG. 2C with that of FIG. 3B, it will be noticed that the response amplitude of the OR logic gate of FIG. 3A is larger compared to that of the XOR logic gate of FIG. 2A. This is due to the drive and sense electrode configuration for the OR logic gate of FIG. 3A exciting the second resonance mode better compared to the XOR logic gate of FIG. 2A. This can be addressed, if desired, by optimizing the device used for the XOR logic gate, such as reducing the gap between the beam and the drive/sense electrodes. A similar difference should be noticed between the NOT logic gate of FIG. 2D and the OR logic gate of FIG. 3A.

Figure 4A:
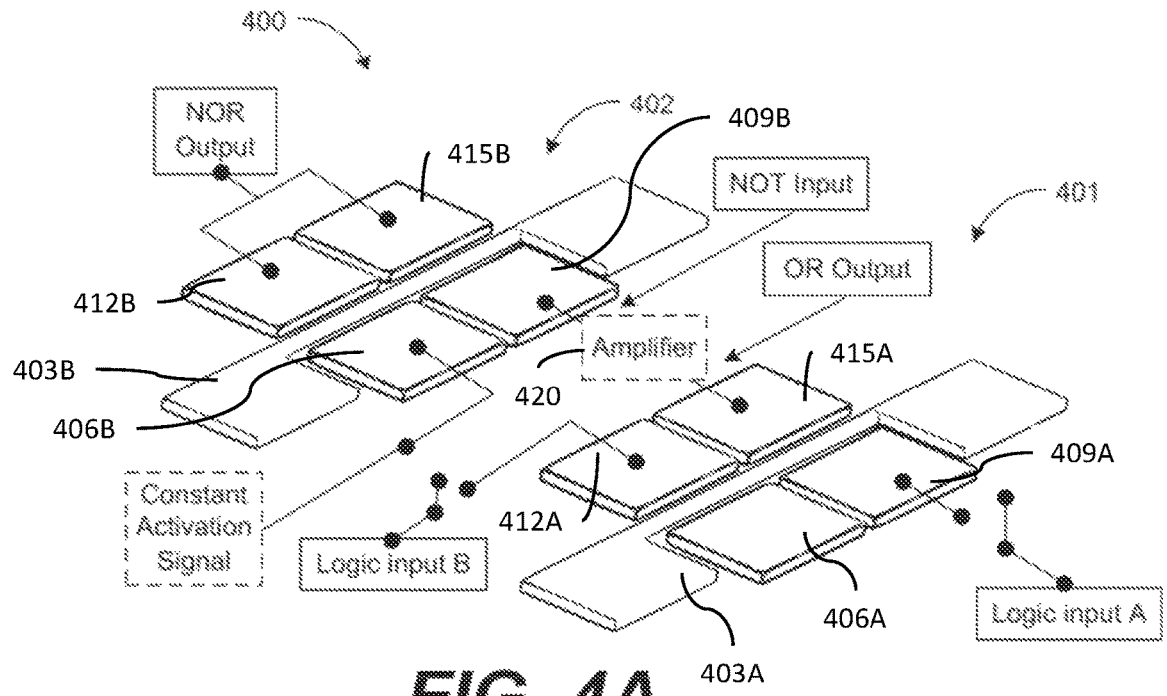
FIG. 4A is an illustration of a logic gate using two mechanical resonator-based cascadable logic devices according to an embodiment.

An example of cascaded mechanical resonator-based logic devices is illustrated in FIG. 4A. The cascaded arrangement forms a NOR gate 400 and has a first mechanical resonator-based cascadable logic device 401 and a second mechanical resonator-based cascadable logic device 402. The first mechanical resonator-based cascadable logic device 401 includes a first resonator, which includes a first beam 403A with first and second fixed ends (not labeled in the figure). A first electrode 406A and second electrode 409A are arranged along a first side of the first beam 403A, and a third electrode 412A and fourth electrode 415A are arranged on a second side of the first beam 403A.

The mechanical resonator-based cascadable logic device 401 is configured to have OR gate operation. The electrodes 409A and 412A being used for the logic input A and the logic input B are diagonal from each other. In other words, the logic device 401 has a diagonal driving configuration, and operates much like the logic device 300 of FIG. 3A. The output of the logic device 401 can be considered an OR output. The OR output of the logic device 401 can be connected to an input of the logic device 402.

The second mechanical resonator-based cascadable logic device 402 includes a second resonator, which includes a second beam 403B with first and second fixed ends (not labeled in the figure). A fifth electrode 406B and sixth electrode 409B are arranged along a first side of the second beam 403B, and a seventh electrode 412B and eighth electrode 415B are arranged on a second side of the second beam 403B.

The logic device 402 is configured to have a NOT gate operation as described above in the discussion of FIG. 2. Two electrodes on the same side of the resonator 406B and 409B of the logic device 402 are utilized for the constant activation signal and the NOT input, respectively. Both electrodes 412B and 415B on the opposite side from the constant activation signal and the NOT input are utilized as an output of the logic device 402. In other embodiments, a single one of the electrodes can be used as the output of the logic device 402. Because the logic device 401 (OR gate operation) is cascaded with the logic device 402 (NOT gate operation), the output of the logic device 402 is a NOR output. In other words, the output of the logic device 401, which can be an OR output, is connected to the input of the logic device 402, which can be a NOT input. In some embodiments, an amplifier 420 can be used between the OR output of the logic device 401 and the NOT input of the logic device 402.

Thus, two mechanical resonator-based cascadable logic devices can be utilized to realize the universal NOR gate functionality, for example, as shown in the NOR gate 400. NOR gates such as the NOR gate 400 are cascadable in nature since the input/output are pure AC signals having a similar frequency, given by the second mode of each such device.

Figure 4B:
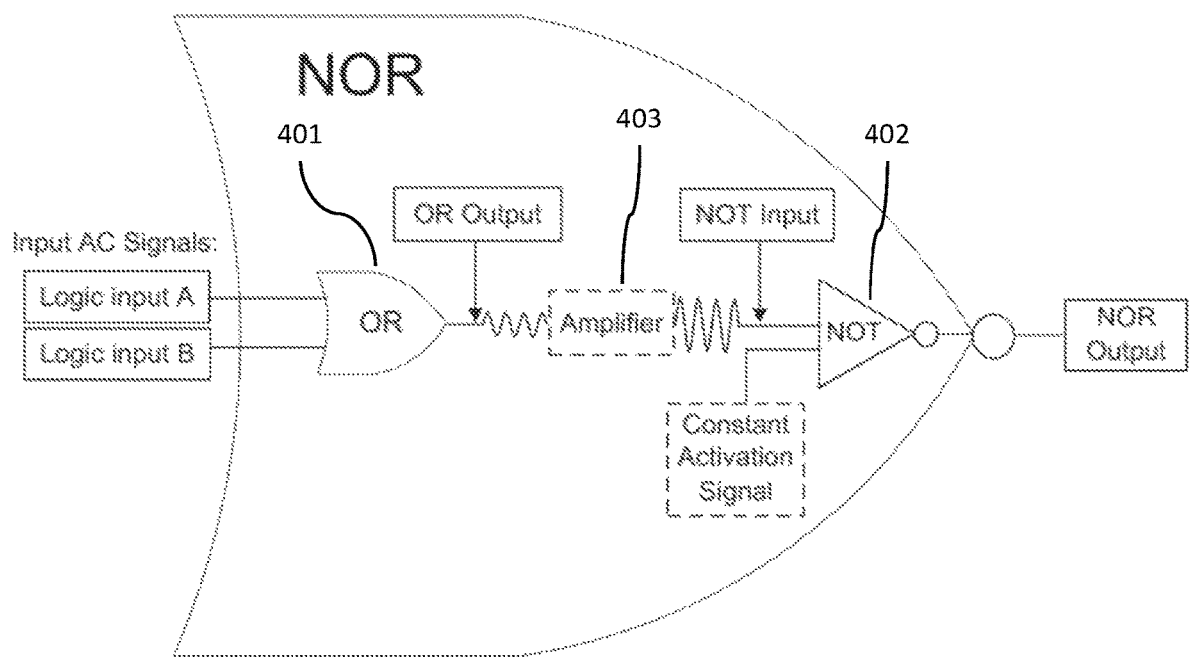
FIG. 4B is a block diagram of the logic gate of FIG. 4A according to an embodiment.

FIG. 4B is a block diagram that illustrates the logic circuit operation of the NOR gate 400 of FIG. 4A. Specifically, logic input AC signals A and B are input to OR gate 401, which produces an OR Output. The OR Output is supplied to an amplifier 403, which feeds one of the two inputs of NOT gate 402. The other input of the NOT gate 402 is fed by a constant activation signal. The output of the NOT gate 402 is the output of the NOR gate 400.

In order to cascade the logic devices, the device should have the same type of input and output waveform (i.e., AC signals) and the same operational frequency. Due to fabrication imperfections, it is difficult to produce two resonators having the resonance frequency. These imperfections can be addressed through tuning using the DC bias voltage applied to the beam.

Because cascading the logic devices involves output signals that are suitable for driving the next logic device, a signal conditioning circuit can be inserted between two logic devices, an example of which is illustrated in FIG. 5. The arrangement in FIG. 5 includes a first OR gate 502 coupled to a current-to-voltage converter 504, which in turn is coupled to a signal conditioning circuit 506. The signal conditioning circuit 506 is coupled to the second OR gate 508.

The current-to-voltage converter 504 comprises a resistor $R_1$ coupled in parallel between the output of OR gate 502 and the input of the signal conditioning circuit 506. The value of the resistor $R_1$ can be selected to match the impedance of the resonator of OR gate 502. The signal conditioning circuit 506 includes a buffer 510 coupled between the input of the signal conditioning circuit 506 and a capacitor $C_2$. The capacitor $C_2$ is coupled to an input of amplifier 512, the output of which is coupled to a capacitor $C_3$. The capacitor $C_3$ is coupled to an input of buffer 514, the output of which is coupled to one of the inputs of the second OR gate 508.

The arrangement in FIG. 5 will now be described in connection with logic 1 inputs to each input of OR gate 502 and a logic 1 provided to one of the inputs of OR gate 508 (which is the output of the first OR gate 502) and a logic 0 provided to the second input of OR gate 508. FIG. 5B illustrates the signal at the output of the first OR gate 502. As illustrated, the output of the logic inputs is a weak output signal that may not be able to drive the second OR gate 508. Accordingly, amplifier 512 increases the signal, as illustrated in FIG. 5C, which is a graph of the signal at the output of the signal conditioning circuit 506. In the illustrated example the single stage amplifier provides a gain of ~60 dB; however, other gains can be employed so long as the amplified signal can drive the second OR gate 508. Buffers 510 and 514 of signal conditioning circuit 506 ensure proper isolation of the signal conditioning circuits and the two OR gates 502 and 508.

Feed-through parasitic capacitance between the input and output electrodes can affect the ability to cascade two mechanical resonators. This can be addressed by arranging an external variable capacitor $C_1$ between the input and output of the first logic OR gate 502. Accordingly, the value of the external variable capacitor $C_1$ can be adjusted to cancel the feed-through signal, which eliminates unwanted parasitic signals coming from previous stages and results in the pure motional signal at the output of the resonator. This results in a larger difference between the high and low output states, i.e., a larger noise margin.

Figure 5A:
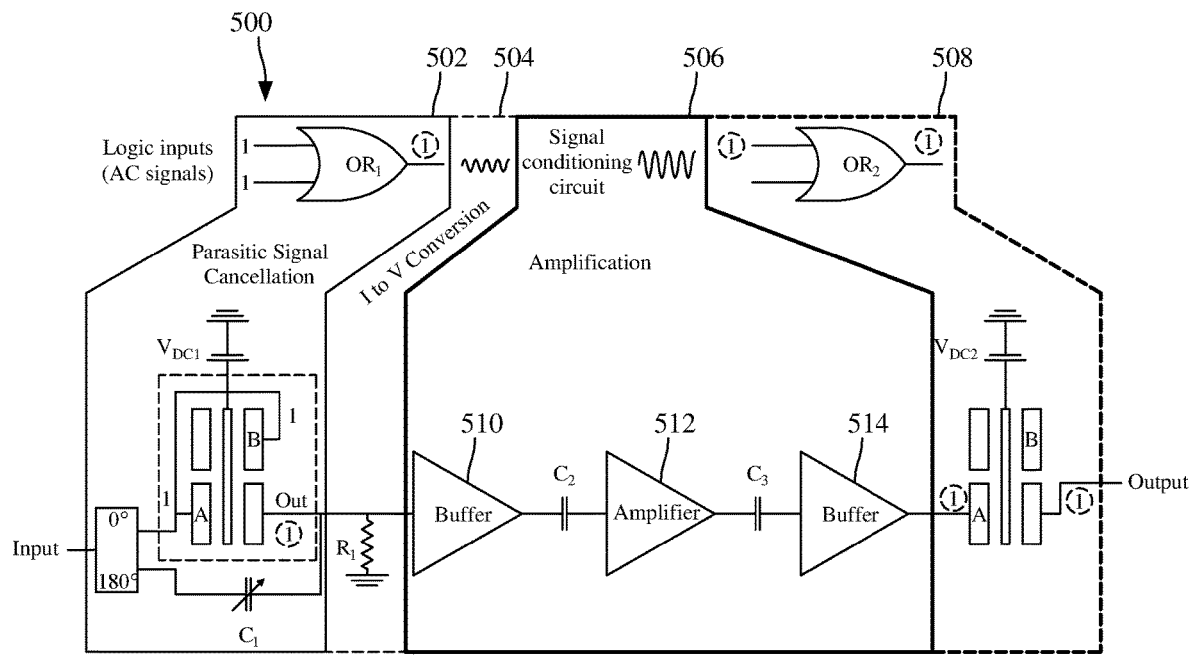
FIG. 5A is a schematic diagram of two cascaded mechanical resonator logic devices according to an embodiment.
Figure 5B:
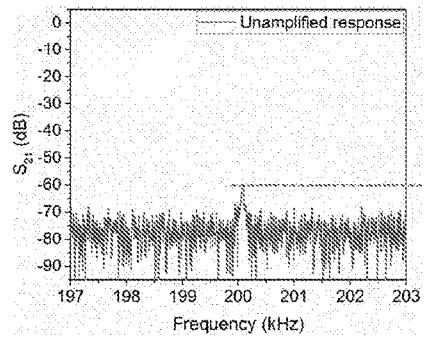
FIGS. 5B-5D are graphs illustrating an example response at various points in the arrangement of FIG. 5A according to an embodiment.
Figure 5C:
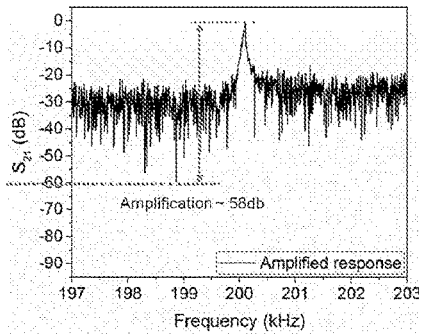
Figure 5D:
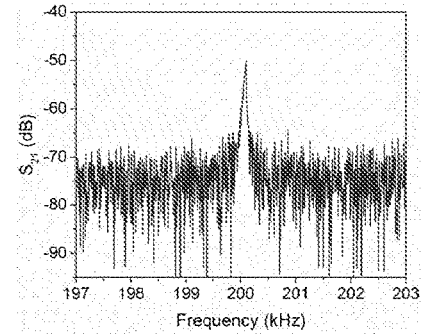

The description of the two cascaded arrangements in FIGS. 4A and 5A are for purposes of illustration and should not be considered limiting. Thus, other types of mechanical resonator-based cascadable logic devices can be cascaded together in any combination. Further, although the cascaded arrangements discussed above involved only two cascaded logic devices, more than two devices can be cascaded consistent with this disclosure. Depending upon the number and arrangement of the more than two cascaded devices, additional current-to-voltage converters, signal conditioning circuits, and/or variable capacitors can be employed.

Figure 6:
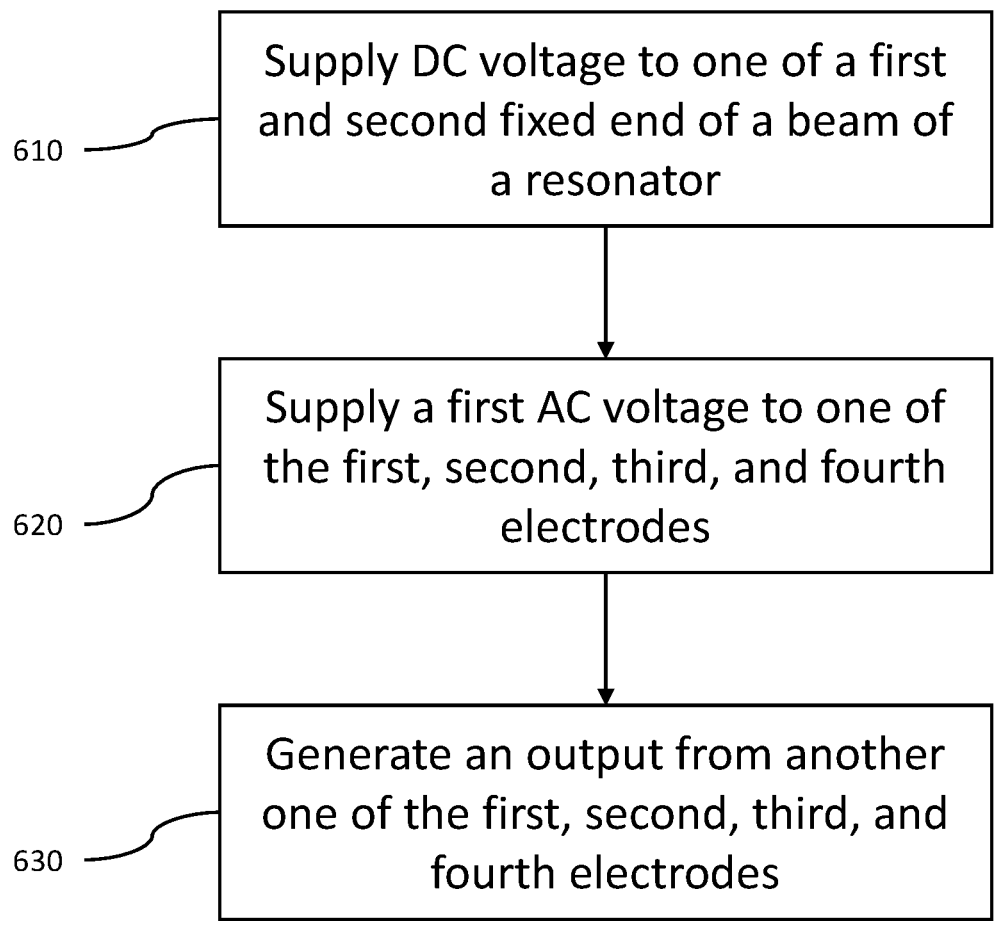
FIG. 6 is a flowchart illustrating an exemplary method for operating a mechanical resonator-based cascadable logic device according to an embodiment.

FIG. 6 is a flowchart illustrating an exemplary method for operating a mechanical resonator-based cascadable logic device according to an embodiment, which will be discussed referencing the devices discussed above. Initially, a DC voltage 117, 217, or 317 is supplied to one of a first 104A, 204A, or 304A and second 104C, 204C, or 304C fixed end of a beam 103, 203, or 303 of a resonator (step 610). A first AC voltage is supplied to one of the first 106, 206A, 206B, 306, or 406A, second 109, 209, 309, or 409A, third 112, 212, 312, or 412A, and fourth 115, 215, 315, or 415A electrodes (step 620). In the device illustrated in FIG. 2A, the first AC voltage, representing a first logic input, is supplied to one of the electrodes 206A and 209 and a second AC voltage, representing a second logic input, is supplied to the other of the electrodes 206A and 209; in the device illustrated in FIG. 2D, the first AC voltage, representing the first logic input, is supplied to electrode 209 and a constant activation signal, as the second logic input, is supplied to electrode 206B; and in the device illustrated in FIG. 3A, the first AC voltage, representing the first logic input, is supplied to one of the electrodes 309 and 312 and the second AC voltage, representing the second logic input, is supplied to the other of the electrodes 309 and 312.

An output is generated from another one of the first, second, third, and fourth electrodes (step 630), the output being the result of a logic operation of at least the first AC voltage. In the devices illustrated in FIGS. 2A and 2D, the output generated by a joint output from electrodes 212 and 215; and in the device illustrated in FIG. 3A, the output is generated by electrode 315.

The disclosed mechanical resonator-based cascadable logic devices can be produced using a highly conductive Si device layer of silicon on insulator (SOI) wafer via a two-mask process. The fabrication process can involve standard photo-lithography for patterning. Sputter deposition and lift-off can be performed for laying down the Cr/Au pads. Deep Reactive Ion Etch (DRIE) can be used to selectively etch the Si device layer to form the desired structure. Finally, HF vapor etch of the $SiO_2$ layer can be performed to release the microstructure.

The disclosed mechanical resonator-based cascadable logic devices provide good maximum operation speed and energy consumption per logic operation, two important aspects of such logic elements. The operation speed of the disclosed devices is limited by the mechanical transition time (Q/f), which is approximately 500 Hz. However, with NEMS resonators reaching the GHz frequency range, operation speed in the MHz range can be expected. The maximum energy consumption per logic operation can be conservatively estimated based on $$E_{AC} = \frac{V^2}{R_m} \cdot t_s,$$

where V=0.007 V (RMS), is the AC driving voltage, $t_s$=2 ms is the switching time, and $R_m$=8 MΩ is the estimated motional resistance of the microresonator. Thus, the maximum energy consumption for the disclosed logic devices per logic operation can be estimated to be around 12.24 fJ. Although devices based on DC modulated logic inputs have relatively less energy consumption to perform the switching operation, a constant source of energy dissipation exists in the form of the activation energy applied as an AC voltage to the resonator. This, in other words, is analogous to the leakage in CMOS based logic devices. The disclosed logic devices address the slow response times and high energy costs of other resonator-based devices, which employ electro-thermal actuation.

Thus, a resonator that performs logic operations via activation and deactivation of a second resonant mode while using same signal waveforms, AC signal, as inputs and outputs can be made using the concepts described herein. A single resonator can be adapted for the fundamental logic gate operations: OR, NOT and XOR at a fixed operating frequency via adjusting the wiring scheme only without any change in its architecture. A resonator that allows cascading of logic gates among them to perform complex computing operations and realizes a universal NOR gate through this cascading scheme by combining OR and NOT gates in series can be achieved. A logic element can be operated at room temperature under moderate level of vacuum (reduced pressure) or in air.

The disclosed embodiments provide cascadable mechanical resonator logic devices. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An apparatus, comprising:
a resonator, including a beam having a first fixed end, a second fixed end, and a length between the first and second fixed ends;
a first electrode and a second electrode aligned along a first side of the beam;
a third electrode and a fourth electrode aligned along a second side of the beam and opposite the first and second electrodes;
a DC voltage source coupled to one of the first and second fixed ends of the beam;
wherein at least one of the first, second, third, and fourth electrodes is coupled to a first AC voltage source so that a logic operation is performed by activating a second resonant mode of the resonator.

2. The apparatus of claim 1, wherein each of the first, second, third, and fourth electrodes are substantially half the length between the first and second fixed ends of the beam.

3. The apparatus of claim 1, wherein the apparatus is an exclusive OR gate, and wherein the first electrode is coupled to the first AC voltage source, the second electrode is coupled to a second AC voltage source, and the third and fourth electrodes are coupled together to provide an AC output of the apparatus.

4. The apparatus of claim 1, wherein the apparatus is a NOT gate, and wherein the first electrode is coupled to the first AC voltage source, the second electrode is coupled to a second AC voltage source, the third and fourth electrodes are coupled together to provide an AC output of the apparatus, and the second AC voltage source is a fixed AC voltage source.

5. The apparatus of claim 1, wherein the apparatus is an OR gate, and wherein the first electrode is a floating electrode not coupled to a voltage source, the second electrode is coupled to the first AC voltage source, the third electrode is coupled to a second AC voltage source, and the fourth electrode provides an AC output of the apparatus.

6. The apparatus of claim 1, wherein the resonator and the first, second, third, and fourth electrodes comprise a first logic device, the apparatus further comprising:
a second logic device, comprising:
a second logic device resonator, including a second logic device beam having a first fixed end, a second fixed end, and a length between the first and second fixed ends;
a fifth electrode and a sixth electrode aligned along a first side of the second logic device beam;
a seventh electrode and an eighth electrode aligned along a second side of the second logic device beam and opposite the fifth and sixth electrodes,
wherein at least one of the first, second, third, and fourth electrodes of the first logic device are coupled to provide an AC output signal to at least one of the fifth, sixth, seventh, and eighth electrodes of the second logic device.

7. The apparatus of claim 6, wherein a current-to-voltage converter is coupled between the first and second logic devices.

8. The apparatus of claim 7, wherein a signal conditioning circuit is coupled between the current-to-voltage converter and the second logic device.

9. The apparatus of claim 8, wherein the signal conditioning circuit includes an amplifier and at least one buffer.

10. The apparatus of claim 6, further comprising:
a variable capacitor coupled between the first AC voltage source and an output of the first logic device.

11. A method, comprising:
supplying a DC voltage to one of a first and second fixed end of a beam of a resonator, wherein the beam has a length between the first and second fixed ends;
supplying a first AC voltage to one of a first, second, third, and fourth electrodes, wherein the first and second electrodes are aligned along a first side of the beam, and the third and fourth electrodes are aligned along a second side of the beam and opposite the first and second electrodes, respectively;
generating an output from another one of the first, second, third, and fourth electrodes, wherein the output is a result of a logic operation of at least the first AC voltage.

12. The method of claim 11, wherein at least one logic state generated from the another one of the first, second, third, and fourth electrodes is obtained by driving the one of the first, second, third, and fourth electrodes asymmetrically relative to the another one so that the resonator operates in its second mode of vibration.

13. The method of claim 11, wherein the logic operation is an exclusive OR operation and the first electrode is supplied with the first AC voltage, the method further comprising:
supplying a second AC voltage to the second electrode, wherein the output is a common output from the third and fourth electrodes.

14. The method of claim 11, wherein the logic operation is a NOT operation and the first electrode is supplied with the first AC voltage, the method further comprising:
supplying the second electrode with a fixed AC voltage, wherein the output is a common output from the third and fourth electrodes.

15. The method of claim 11, wherein the logic operation is an OR operation, and wherein the first electrode is a floating electrode not coupled to a voltage source, the method further comprising:
supplying the third electrode with a second AC voltage, wherein the fourth electrode is the output.

16. The method of claim 11, wherein the resonator and the first, second, third, and fourth electrodes comprise a first logic device, the method further comprising:
supplying the output from the another one of the first, second, third, and fourth electrodes to a second logic device.

17. The method of claim 16, further comprising:
converting the output from the another one of the first, second, third, and fourth electrodes from a current to a voltage; and
amplifying the voltage, wherein the amplified voltage is applied to one of a fifth, sixth, seventh, and eighth electrode of the second logic device.

18. An apparatus, comprising:
a first logic device, comprising
a first resonator, including a first beam having a first fixed end, a second fixed end, and a length between the first and second fixed ends;
a first electrode and a second electrode aligned along a first side of the beam;
a third electrode and a fourth electrode aligned along a second side of the beam and opposite the first and second electrodes; and
a second logic device, comprising
a second resonator, including a second beam having a first fixed end, a second fixed end, and a second length between the first and second fixed ends;
a fifth electrode and a sixth electrode aligned along a first side of the second beam;
a seventh electrode and an eighth electrode aligned along a second side of the second beam and opposite the fifth and sixth electrodes,
wherein a first AC voltage source is coupled to one of the first, second, third, and fourth electrodes, and another one of the first, second, third, and fourth electrodes is coupled to one of the fifth, sixth, seventh, and eighth electrodes.

19. The apparatus of claim 18, further comprising:
a current-to-voltage converter coupled the another one of the first, second, third, and fourth electrodes; and
a signal conditioning circuit having an input coupled an output of the current-to-voltage converter and an output coupled to the one of the fifth, sixth, seventh, and eighth electrodes.

20. The apparatus of claim 19, wherein the signal conditioning circuit comprises at least one buffer and an amplifier.

* * * * *